US011948659B2

(12) United States Patent
Yang et al.

(10) Patent No.: US 11,948,659 B2
(45) Date of Patent: Apr. 2, 2024

(54) SUB-CELL, MAC ARRAY AND BIT-WIDTH RECONFIGURABLE MIXED-SIGNAL IN-MEMORY COMPUTING MODULE

(71) Applicant: Reexen Technology Co., Ltd., Guangdong (CN)

(72) Inventors: Minhao Yang, Zürich (CH); Hongjie Liu, Guangdong (CN); Alonso Morgado, Villach (AT); Neil Webb, Kilchberg (CH)

(73) Assignee: Reexen Technology Co., Ltd., Guangdong (CN)

( * ) Notice: Subject to any disclaimer, the term of this patent is extended or adjusted under 35 U.S.C. 154(b) by 128 days.

(21) Appl. No.: 17/762,447

(22) PCT Filed: Mar. 30, 2021

(86) PCT No.: PCT/CN2021/084022
§ 371 (c)(1),
(2) Date: Mar. 22, 2022

(87) PCT Pub. No.: WO2021/232949
PCT Pub. Date: Nov. 25, 2021

(65) Prior Publication Data
US 2022/0351761 A1 Nov. 3, 2022

(30) Foreign Application Priority Data

May 18, 2020 (CN) .......................... 202010418649.0

(51) Int. Cl.
*G11C 7/00* (2006.01)
*G06F 7/544* (2006.01)
(Continued)

(52) U.S. Cl.
CPC .......... *G11C 7/1069* (2013.01); *G06F 7/5443* (2013.01); *G11C 7/109* (2013.01); *G11C 7/16* (2013.01)

(58) Field of Classification Search
CPC ......... G11C 7/1069; G11C 7/109; G11C 7/16; G11C 11/41; G11C 11/54; G06F 7/5443;
(Continued)

(56) References Cited

U.S. PATENT DOCUMENTS 6,850,103 B2 * 2/2005 Ikeno ................... H03K 3/0375
327/202
7,898,837 B2 * 3/2011 McAdams .............. G11C 11/22
365/189.04
(Continued)

FOREIGN PATENT DOCUMENTS

| CN | 101662283 A | 3/2010 |
|---|---|---|
| CN | 101807923 | 8/2010 |

(Continued)

OTHER PUBLICATIONS

Jiang et al., "C3SRAM: In-Memory-Computing SRAM Macro Based on Capacitive-Coupling Computing", Solid-State Circuits Letters, vol. 2, No. 9, Sep. 2019, pp. 131-134.
(Continued)

*Primary Examiner* — Tha-O H Bui
(74) *Attorney, Agent, or Firm* — Dority & Manning, PA

(57) ABSTRACT

A mixed-signal in-memory computing sub-cell only requires 9 transistors for 1-bit multiplication. A computing cell is constructed from a plurality of such sub-cells that share a common computing capacitor and a common transistor. A MAC array for performing MAC operations, includes a plurality of the computing cells each activating the sub-cells therein in a time-multiplexed manner. A differential version of the MAC array provides improved computation error
(Continued)

tolerance and an in-memory mixed-signal computing module for digitalizing parallel analog outputs of the MAC array and for performing other tasks in the digital domain. An ADC block in the computing module makes full use of capacitors in the MAC array, allowing the computing module to have a reduced area and suffer from fewer computational errors.

13 Claims, 8 Drawing Sheets

(51) Int. Cl.
  *G11C 7/10* (2006.01)
  *G11C 7/16* (2006.01)
(58) Field of Classification Search
  CPC .......... Y02D 10/00; G06N 3/04; G06N 3/065; H03M 1/462; H03M 1/468
  USPC ........................................................ 365/191
  See application file for complete search history.

(56) References Cited

U.S. PATENT DOCUMENTS

| | | | |
|---|---|---|---|
| 8,164,943 B2* | 4/2012 | Sachdev | G11C 11/4125 365/189.08 |
| 9,058,126 B2* | 6/2015 | Bartling | G06F 11/1469 |
| 10,381,071 B1 | 8/2019 | Si et al. | |
| 11,669,446 B2* | 6/2023 | Verma | G11C 7/1006 711/157 |
| 2012/0119808 A1 | 5/2012 | Motozawa et al. | |
| 2013/0194120 A1 | 8/2013 | El-Chammas | |
| 2014/0133218 A1 | 5/2014 | Liaw | |
| 2014/0210535 A1 | 7/2014 | Bartling et al. | |
| 2020/0259500 A1 | 8/2020 | Guo et al. | |

FOREIGN PATENT DOCUMENTS

| | | |
|---|---|---|
| CN | 102332921 A | 1/2012 |
| CN | 102394102 | 3/2012 |
| CN | 103165177 A | 6/2013 |
| CN | 110414677 | 11/2019 |
| CN | 110598858 | 12/2019 |
| CN | 110941185 | 3/2020 |
| CN | 111079919 A | 4/2020 |
| CN | 111144558 | 5/2020 |
| CN | 111431536 | 7/2020 |
| EP | 3989445 A1 | 4/2022 |
| WO | WO 2019/246064 A1 | 12/2019 |
| WO | WO 2021/178660 A1 | 9/2021 |

OTHER PUBLICATIONS

Supplementary European Search Report for corresponding Application No. EP 21800372, dated Jul. 8, 2022, 11 pages.
Chinese Search Report for corresponding CN Application No. 202010418649.0, dated Mar. 13, 2023, 5 pages.
PCT International Search Report (w/ English translation) for corresponding PCT Application No. PCT/CN2021/084022, dated Jun. 30, 2021, 6 pages.
Bankman et al., "An always-on 3.8μJ/86% CIFAR-10 mixed-signal binary CNN processor with all memory on chip in 28nm CMOS", IEEE Journal of Solid-State Circuits, Jan. 2019, vol. 54, No. 1, 15 pages.
Biswas et al., "Conv-RAM: An Energy-efficient SRAM with Embedded Convolution Computation for Low-power CNN based Machine Learning Applications", 2018 IEEE International Solid-State Circuits Conference (ISSCC), Feb. 11-15, 2018, San Francisco, California, 12 pages.
Jia et al., "A Microprocessor implemented in 65nm CMOS with Configurable and Bit-scalable Accelerator for Programmable In-memory Computing", arXiv: 1811.04047, 2020, 10 pages.
Valavi et al., "A Mixed-Signal Binarized Convolutional-Neural-Network Accelerator Integrating Dense Weight Storage and Multiplication for Reduced Data Movement", 32nd IEEE Symposium on VLSI Circuits, VLSI Circuits, Jun. 18-22, 2018, Honolulu, HI, 2 pages.
Extended European Search Report for corresponding European Application No. 21808967.0, dated Nov. 18, 2022, 18 pages.

* cited by examiner

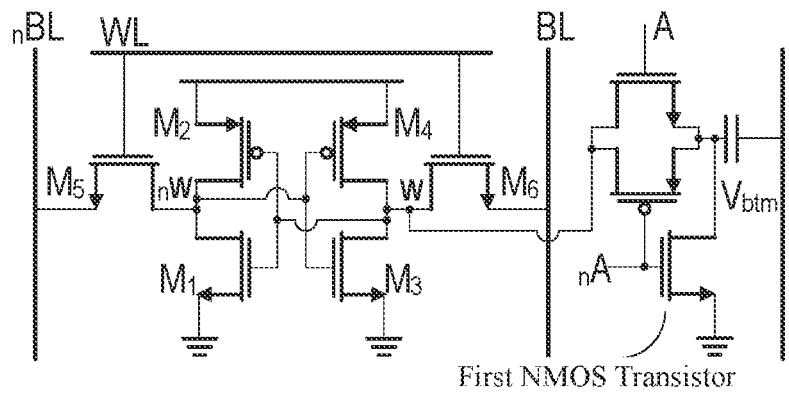
Fig. 1
| Stored | Input | | | Output |
|---|---|---|---|---|
| W | A | nA | B | $V_{btm}$ |
| 0 | 0 | 1 | 1 | 0 |
| 0 | 1 | 0 | 0 | 0 |
| 1 | 0 | 1 | 1 | 0 |
| 1 | 1 | 0 | 0 | 1 |
Fig. 2
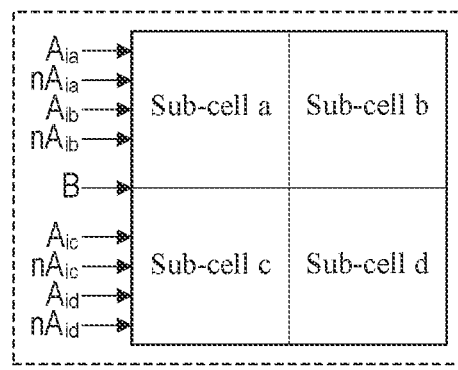
Fig. 3a

| Stored | Input | | | Output |
|---|---|---|---|---|
| $W_{0a}$ | $A_{0a}$ | $nA_{0a}$ | B | $V_{btm0}$ |
| 0 | 0 | 1 | 1 | 0 |
| 0 | 1 | 0 | 0 | 0 |
| 1 | 0 | 1 | 1 | 0 |
| 1 | 1 | 0 | 0 | 1 |

SUB-CELL, MAC ARRAY AND BIT-WIDTH RECONFIGURABLE MIXED-SIGNAL IN-MEMORY COMPUTING MODULE

This application is a national phase application of International Patent Application No. PCT/CN2021/084022, filed Mar. 30, 2021, which, in turn, claims the priority of Chinese Patent Application No. 202010418649.0, filed in the China National Intellectual Property Administration on May 18, 2020, entitled "Sub-cell, MAC Array, Bit-width Reconfigurable Mixed-signal In-memory Computing Module", both of which are hereby incorporated herein by reference in their entirety for all purposes.

TECHNICAL FIELD

The present invention relates to the field of mixed-signal in-memory computing and, more specifically, to a sub-cell, a MAC array and a bit-width reconfigurable mixed-signal in-memory computing module.

BACKGROUND

The existing mobile and emerging edge applications like the internet of things call for high energy efficiency and high throughput per unit area. High energy efficiency means longer battery life, and high throughput per unit area means reduced area with a specified throughput, and in turn reduced cost. Nowadays, the feedforward inference computation in deep neural networks (DNN) is dominated by multiply-accumulate (MAC) operations, which require energy- and area-efficient implementation of MAC and reduced movement of the data to be processed. MAC implementation with traditional digital integrated circuits has a variety of advantages such as high tolerance to noise, high accuracy, good scalability and well-established design methodologies, but is not suitable to implement high energy-efficient large-scale neural networks due to the digital circuits' large chip areas and high power consumption. Moreover, the bottleneck of data exchange between memory and central processing unit (CPU) in Von Neumann architectures employed in the traditional digital circuits poses severe limitations on computing energy efficiency and computing speed for massive data movement in DNN applications. MAC implementation with analog circuits is advantageous in structural simplicity and low power dissipation. Therefore, analog and mixed-signal computation has a potential in achieving high energy efficiency. The implementation of in-memory computing which has been proposed to overcome the bottleneck in Von Neumann architectures and drawn much attention recently is impossible in nature only by digital circuits, and the support of analog circuits is indispensable. Further, DNN application-specific integrated circuits (ASIC) are regaining the attention because of DNN's tolerance to circuit noise including computation errors.

As taught in "A mixed-signal binarized convolutional-neural-network accelerator integrating dense weight storage and multiplication for reduced data movement", DOI: 10.1109/VLSIC.2018.8502421 (identified hereinafter as "Literature 1") and "A Microprocessor implemented in 65 nm CMOS with configurable and bit-scalable accelerator for programmable in-memory computing", arXiv: 1811.04047 ("Literature 2"), a 1-bit MAC operation consists of a multiplication portion equivalent to XNOR operations of 1-bit weights and a 1-bit input, whose results are stored in the form of voltages in capacitors, and an accumulation portion that obtains a result of the 1-bit MAC operation through equal sharing of a constant total amount of charge among the capacitors. Each 1-bit computing cell involved in this 1-bit MAC operation has 10 transistors. These conventional techniques described in Literatures 1 and 2 are associated with the following problems: (1) the transmission gate in each computing cell is unconditionally driven for every accumulation operation, disallowing the sparsity of input data to be utilized for power savings; (2) each 1-bit multiplication cell is separately equipped with an individual capacitor, and the metal-oxide-metal (MOM) capacitors of the successive approximation register (SAR) analog-to-digital converters (ADCs) are located outside of the computing static random access memory (SRAM) array because there is no space inside the array, which reduces the area efficiency; and (3) the accumulation operation through charge sharing requires connecting the top plates of the capacitors that store the XNOR operation results. This circuit topology makes the accumulation vulnerable to non-ideal effects like charge injection, clock feedthrough, nonlinear parasitic capacitance at the drains/sources of the transmission gate transistors, and leakage of the transistors connected to the capacitors' top plates, which result in computation errors. Further, the mismatch between the computing capacitors and digital-to-analog converter (DAC) capacitors in the ADCs resulted from physical layout mismatch can also result in computation errors.

In "An always-on 3.8 µJ/86% CIFAR-10 mixed-signal binary CNN processor with all memory on chip in 28 nm CMOS", DOI: 10.1109/ISSCC.2018.8310264 ("Literature 3"), there is provided a computing module only supporting binarized neural networks (BNN) with both weights and activations in binary representation. This computing module has the following shortcomings: (1) it has a limited scope of application because it only supports BNN and cannot be used in large DNN models for vision applications like object detection; and (2) 1-bit multiplication requires many transistors including at least one OR gate, two XNOR gates, two NOR gates and one latch, which take up a large area.

In "Conv-RAM: an energy-efficient SRAM with embedded convolution computation for low-power CNN-based machine learning applications", DOI: 10.1109/ISSCC.2018.8310397 ("Literature 4"), there is provided an energy-efficient SRAM with embedded convolution computation. This SRAM has the following deficiencies: (1) each 1-bit computing SRAM cell has 10 transistors, and the higher the number of transistors in each unit, the smaller the storage density; (2) it utilizes the parasitic capacitance on bit lines to store charge for the subsequent averaging operation, and the bit line parasitic capacitance is not well modeled and may suffer from larger mismatch compared to explicit capacitors like MOM capacitors, leading to inferior computation accuracy; (3) the horizontal charge averaging method used requires 6 extra transistors shared among several rows of cells, which limits the throughput because not all rows can perform the computation simultaneously; (4) the common-mode voltage on the differential charge averaging lines $Vp_{AVG}$ and $Vn_{AVG}$ is dependent on the magnitude of the input data $X_{in}$ and has been found to be inconstant as determined in an average value assessment using a local MAV circuit, so energy-efficient high-speed ADCs like SAR ADC cannot be easily used, and instead a ramp-based ADC that takes maximum $2^N-1$ (N is the ADC resolution) steps to converge is used, which compromises the computation throughput; and (5) the input of the array uses an explicit DAC circuit to convert the input data $X_{in}$ (usually feature maps) from digital to analog representation, which characteristics are non-ideal and leads to additional accuracy loss, and area and energy overhead.

In summary, for computation in neural networks, the conventional MAC arrays are suffering from the following problems: each computing cell for 1-bit multiplication has too many transistors; there is one-to-one correspondence between capacitors storing the multiplication results to be accumulated and memory elements, i.e., the number of memory elements is equal to that of capacitors, but as one capacitor's area may be much larger than that of one SRAM cell, the capacitors can take up a significant proportion of the MAC array area, in particular when an advanced process is used; the transistors are unconditionally driven for every accumulation operation, leading to inferior energy efficiency; and a high rate of computation errors leads to a limited scope of application.

Therefore, in the field of mixed-signal in-memory computing, there is an urgent need for a bit-width reconfigurable mixed-signal in-memory computing module with a reduced area, high energy efficiency and good error tolerance.

SUMMARY

In view of the above, it is an object of the present invention to provide a sub-cell, a MAC array and a bit-width reconfigurable mixed-signal in-memory computing module. It is another object of the present invention to reduce computation errors by providing a differential version of the MAC array. These objects are attained by the following inventive aspects.

In a first aspect, there is provided an in-memory mixed-signal computing sub-cell for 1-bit multiplication, comprising a conventional 6T SRAM cell, a complementary transmission gate, a first NMOS transistor and a computing capacitor, the conventional 6T SRAM cell consisting of MOS transistors $M_1$, $M_2$, $M_3$, $M_4$, $M_5$, $M_6$, in which a complementary metal-oxide-semiconductor (CMOS) inverter consisting of the MOS transistors $M_1$, $M_2$ is cross-coupled to a CMOS inverter consisting of the MOS transistors $M_3$, $M_4$, the cross-coupled two CMOS inverters store a 1-bit filter parameter, and the MOS transistors $M_5$, $M_6$ serve as control switches for bit lines for reading and writing the filter parameter, the CMOS inverter consisting of the MOS transistors $M_1$, $M_2$ in the conventional 6T SRAM cell comprising an output connected to an input of a complementary transmission gate, the complementary transmission gate comprising an output connected to a drain of the first NMOS transistor, the first NMOS transistor comprising a source that is grounded, the drain of the first NMOS transistor connected to a bottom plate of the computing capacitor, the complementary transmission gate comprising an NMOS transistor comprising a gate connected to an input signal during computation, the complementary transmission gate comprising a PMOS transistor comprising a gate at the same voltage level during computation as a signal input to a gate of the first NMOS transistor, wherein a multiplication result of the input signal and the filter parameter is stored as a voltage on the bottom plate of the computing capacitor, and a plurality of such sub-cells are arranged to form a computing cell in such a manner that the first NMOS transistor and the computing capacitor are shared among all the computing sub-cells in the computing cell.

In this design, the filter parameter/weight w is written into and stored in the SRAM cell, and the input signal A is connected to the gate of the NMOS transistor in the complementary transmission gate. Additionally, the gate of the PMOS transistor in the complementary transmission gate is connected to the complementary input signal nA, and the gate of the first NMOS transistor is connected to the signal B. In particular, in this computing sub-cell, the complementary input signal nA is kept at the same voltage level as the signal B during computation. This topology can avoid unconditionally driving of the complementary transmission gate, resulting in improved energy efficiency. For example, when the signal B=0, signal nA=0, input signal A=1 and filter parameter w=1, the branch of the computing capacitor connecting the first NMOS transistor is not conducting, while the branch of the computing capacitor connecting the complementary transmission gate is conducting. As a result, the multiplication result of the filter parameter w and the input signal A is stored as the bottom plate voltage $V_{btm}$ of the computing capacitor. In this way, the sub-cell for 1-bit multiplication (of the filter parameter w and the input signal A) has only 9 transistors and thus a reduced area. The complementary transmission gate is avoided from being connected to a top plate of the computing capacitor for charge accumulation. This can minimize computation errors, in particular those caused by clock feedthrough introduced with MOS transistor switches, charge injection occurring during on-to-off switching, nonlinear parasitic capacitance at the drains/sources of the transistors in the complementary transmission gate and leakage of the transistors themselves.

In some embodiments, a plurality of such sub-cells may be arranged to form a computing cell in such a manner that the first NMOS transistor and the computing capacitor are shared among all the sub-cells in the computing cell. The sub-cells may be arranged in a feasible shape such as 2×2, 4×2, etc. Intuitively, this arrangement reduces the numbers of first NMOS transistors and computing capacitors used. For example, in a computing cell composed of 2×2 sub-cells, the number of the first NMOS transistors is reduced by 3 and the number of the computing capacitors is reduced by 3.

In particular, the greater the number of sub-cells that share the first NMOS transistor and the computing capacitor, the closer the average number of transistors in each sub-cell to 8, and the smaller the area per sub-cell.

On the basis of the first aspect, in some embodiments, the sub-cells in the computing cell may be activated in a time-multiplexed manner where, when one of the sub-cells is activated, all the other sub-cells are deactivated. In this way, after an in-memory computation is completed in one sub-cell, another in-memory computation can be immediately initiated with a filter parameter stored in the SRAM cell of another sub-cell, without waiting for the transfer of data from outside into the SRAM. This results in significant enhancements in computation speed and throughput, and results in reductions in power consumption and area consumption.

In a second aspect, there is provided a MAC array for performing MAC operations, which comprises sub-cells according to the first aspect or possible implementations thereof. This MAC array includes a plurality of computing cells, and in each column of computing cells, the top plates of all the computing capacitors are connected to a respective accumulation bus.

In contrast to a MAC array composed of separate individual sub-cells, each computing cell in this design shares a common capacitor and a common transistor, allowing the MAC array to store more neural network parameters or activations for the next network layer. Specifically, the results of 1-bit multiplication operations in the computing cells are stored in the computing capacitors, and the 1-bit multiplication results from the computing cells of each column in the MAC array are accumulated by the respective accumulation bus to which the top plates of the computing capacitors are connected, wherein a voltage on each accumulation bus corresponds to an accumulated sum of multiplication operation results of the respective column of the MAC array.

In addition, as the area of a capacitor is typically several times that of a 6T SRAM cell, compared to other designs with each 1-bit multiplication sub-cell being separately equipped with an individual computing capacitor for storing a computation result, the arrangement with multiple 1-bit multiplication sub-cells sharing a common transistor and a common computing capacitor for computation and storage can greatly improve the storage capacity per unit area. For in-memory computing, reducing data movement between inside and outside is the most important way to reduce power consumption. The MAC array of this design contains more SRAM cells per unit area, which can store more filter parameters of a neural network, reducing data movement.

On the basis of the second aspect, in some embodiments, the MAC array may further include differential complementary transmission gates, differential computing capacitors and first PMOS transistors, wherein in each computing cell in the MAC array, the output of the CMOS inverter consisting of the MOS transistors $M_3$, $M_4$ in each conventional 6T SRAM cell is connected to an input of a respective one of the differential complementary transmission gates, and all these differential complementary transmission gates connected to the respective CMOS inverters each consisting of the MOS transistors $M_3$, $M_4$ are connected at their outputs to a drain of a respective one of the first PMOS transistors, the drain of the respective first PMOS transistor being in turn connected to a bottom plate of a respective one of the differential computing capacitors, the respective first PMOS transistor comprising a source connected to VDD. Differential multiplication results may be stored as bottom plate voltages of the respective differential computing capacitors, and top plates of the differential computing capacitors of the differential computing cells in each column may be connected to a respective differential accumulation bus.

On the basis of the second aspect, in some other embodiments, the MAC array may further comprise first CMOS inverters and differential computing capacitors, wherein in each of the computing cells in the MAC array, the outputs of all the complementary transmission gates are connected to an input of a respective one of the first CMOS inverters, which is in turn connected at an output thereof to a bottom plate of a respective one of the differential computing capacitors. Differential multiplication results may be stored as bottom plate voltages of the respective differential computing capacitors, and top plates of the differential computing capacitors in each column may be connected to a respective differential accumulation bus.

In a third aspect, there is provided a bit-width reconfigurable mixed-signal in-memory computing module, comprising:

a MAC array according to the second aspect or possible implementations thereof, wherein column-wise accumulation results of multiplication results in the array are represented in the form of analog voltages;

a filter/ifmap block for providing filter parameters or activations from computation in the previous layer, which are written into and stored in the MAC array; an ifmap/filter block for providing an input to the MAC array, which is subject to MAC operations with the filter parameters or the activations from computation in the previous layer; an ADC block for converting the analog voltages from the MAC array to their digital representations; and a digital processing block for performing at least multi-bit fusion, biasing, scaling or nonlinearity on the output of the ADC block and outputting results in the form of partial sums or activations directly usable as an input to the next network layer.

In this design, the filter parameters or activations from computation in the neural network's previous layer are written into and stored in the MAC array via the filter/ifmap block following the conventional 6T SRAM write procedure so that logic 1 or 0 are stored in the SRAM of the sub-cells, and are subject to MAC operations with the input provided by the ifmap/filter block. In this process, the stored values in the sub-cells are multiplied with the input by digital operations that are equivalent to AND operations, and the multiplication results are stored in the computing capacitors. In the accumulation portion, as the top plates of the computing capacitors in each column are connected together by a respective accumulation bus, charge stored in the computing capacitors is shared via the accumulation bus. The column-wise accumulation results are represented in the form of analog voltages, which are then converted into their digital representations by the ADC block. The digital representations are processed, and the final output results are partial sums or activations usable as an input to the next network layer. In neural networks, much power is consumed in MAC operations. In this design, the mixed-signal MAC operations can greatly reduce power consumption, and the reduced area implementation of the MAC array can result in improved energy efficiency and a faster computation speed. Using different combinations of operations in different phases of computation in neural networks allows different benefits of analog and digital operations to be effectively taken advantage of to ensure low computational power consumption, high energy efficiency, a high speed and high accuracy.

On the basis of the third aspect, in one possible implementation, the ADC block may be implemented as SAR ADCs, in particular binarily weighted capacitive SAR ADCs.

On the basis of the third aspect and the first possible implementation, in a second possible implementation, the sparsity of the MAC array's input and stored values may spare some capacitors in the SAR DACs from switching in order to achieve higher energy efficiency and faster analog-to-digital conversion. In other words, a bit-width of the SAR ADC for each column in the MAC array may be determined in real time by the sparsity of the input and stored values.

On the basis of the third aspect or the first or second possible implementation thereof, in a third possible implementation, each SAR DAC may be connected together with a MAC DAC. It will be appreciated that the MAC DAC is a respective column of computing capacitors in the MAC array. Thus, the capacitors in the column of the MAC array may be connected in parallel with capacitors in the SAR DAC.

On the basis of the third aspect or the first, second or third possible implementation thereof, in a fourth possible implementation, the reuse of the MAC DAC as the SAR DAC is allowed via bottom-plate sampling. In this way, both MAC operation and analog-to-digital conversion can be accomplished with a single capacitor array, avoiding mismatch and accuracy loss caused by the use of separate capacitor arrays for the MAC DAC for performing MAC operations and the SAR DAC for achieving analog-to-digital conversion, allowing the possibility of fully-differential SAR ADC, and better solving the problem of common-mode dependent comparator input offset voltage.

BRIEF DESCRIPTION OF THE DRAWINGS

FIG. 1 is a structural schematic of a sub-cell for 1-bit multiplication according to an embodiment of the present invention;

FIG. 2 schematically illustrates a truth table for the 1-bit multiplication sub-cell according to an embodiment of the present invention;

FIG. 3a is a schematic diagram illustrating an arrangement of sub-cells in a computing cell according to an embodiment of the present invention;

DETAILED DESCRIPTION

Figures 3B, 3C:
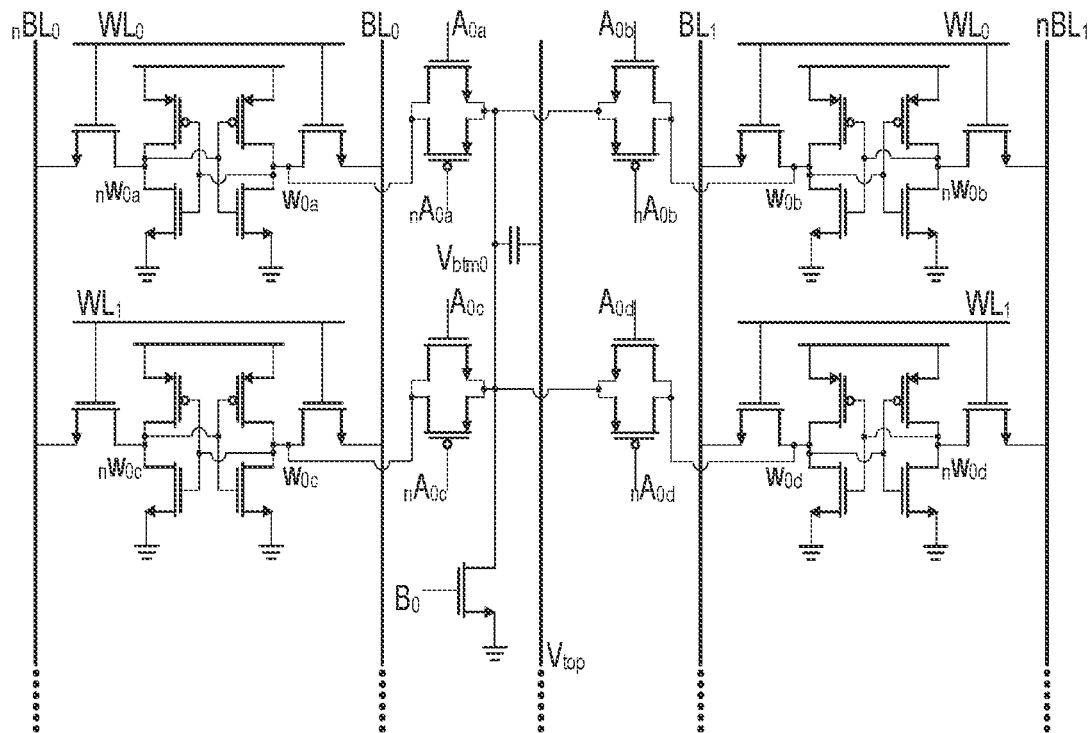
FIG. 3b is a schematic illustration of a computing cell composed of a plurality of sub-cells according to an embodiment of the present invention.
FIG. 3c schematically illustrates a truth table used during operation of the computing cell according to an embodiment of the present invention.

The objects, principles, features and advantages of the present invention will become more apparent from the following detailed description of embodiments thereof, which is to be read in connection with the accompanying drawings. It will be appreciated that the particular embodiments disclosed herein are illustrative and not intended to limit the present invention, as also explained somewhere else herein.

It is particularly noted that, for the brevity of illustration, some connections or positional relationships that can be inferred from the text of this specification or the teachings disclosed herein are omitted in the figures, or not all positional changes are depicted. Such positional changes that are not clearly described or illustrated should not be considered as having not taken place. As collectively clarified here, this will not be explained separately in the following detailed description, for the sake of conciseness.

As a common application scenario, bit-width reconfigurable mixed-signal computing modules provided in embodiments of the present invention can be used in visual and acoustic DNN architectures, in particular in object detection, acoustic feature extraction with low power consumption, etc.

For example, in the case of feature extraction, a feature extractor convolves data to be processed with a filter consisting of weights and outputs feature maps. Depending on the filter selected, different features may be extracted. In this process, the convolution operation of the data to be processed with the filter is most power-consuming, necessitating the avoidance of power consumption in unconditional circuit driving or the like, in particular when the data to be processed is a sparse matrix.

FIG. 1 is a structural schematic of a sub-cell for 1-bit multiplication according to an embodiment of the present invention, which includes a conventional 6T SRAM cell, a complementary transmission gate, a first NMOS transistor and a computing capacitor. The conventional 6T SRAM cell consists of MOS transistors $M_1$, $M_2$, $M_3$, $M_4$, $M_5$, $M_6$. A CMOS inverter consisting of the MOS transistors $M_1$, $M_2$ is cross-coupled to a CMOS inverter consisting of the MOS transistors $M_3$, $M_4$. The cross-coupled two CMOS inverters store a 1-bit filter parameter, and the MOS transistors $M_5$, $M_6$ act as control switches for bit lines for reading and writing the filter parameter.

An output of the CMOS inverter consisting of the MOS transistors $M_1$, $M_2$ in the conventional 6T SRAM cell is connected to an input of the complementary transmission gate, and an output of the complementary transmission gate is connected to a drain of the first NMOS transistor.

A source of the first NMOS transistor is grounded, and the drain thereof is connected to a bottom plate of the computing capacitor.

During computation, in the complementary transmission gate of the sub-cell, a gate of an NMOS transistor is connected to an input signal and a gate of a PMOS transistor is at the same voltage level as a signal input to a gate of the first NMOS transistor.

A multiplication result of the input signal and the filter parameter is stored as a voltage on the bottom plate of the computing capacitor, and a plurality of such computing sub-cells are arranged to form a computing cell in such a manner that the first NMOS transistor and the computing capacitor are shared among all the sub-cells in the computing cell.

The input signals at the NMOS and PMOS gates of the complementary transmission gate are denoted at A and nA, and the signal at the gate of the first NMOS transistor are denoted at B. In particular, as shown in FIG. 1, in the sub-cell, the signals B and nA may be the same. In some possible embodiments, the signals B and nA may be at the same voltage level by connecting both to a common node. The conventional 6T SRAM stores the filter parameter W that is written therein following the conventional 6T SRAM write procedure, in which a word line WL is set to VDD and bit lines BL, nBL to 0 or 1 depending on the value to be written. For example, in order to write "0", the word line WL is set at a high voltage level to VDD, and the MOS transistors $M_5$ and $M_6$ are both conducting. Moreover, the bit line BL is set to 0 and nBL to VDD. As a result, a voltage at W drops via $M_6$, representing logic 0; and a voltage at nW rises via $M_5$, representing logic 1.

Optionally, the sub-cell may follow the procedure below to perform a 1-bit multiplication operation:

1. Reset a top plate voltage $V_{top}$ of the computing capacitor to $V_{rst}$ through a reset switch $S_{rst}$ on the accumulation bus.

2. Conduct the first NMOS transistor in the sub-cell by raising the signal B at its gate to VDD, thus resetting the bottom plate voltage $V_{btm}$ of the capacitor to 0, keep the input signals A and nA in the complementary transmission gate of the sub-cell at 0 and VDD, respectively, and disconnect $S_{rst}$ after $V_{btm}$ is reset to 0.

3. During computation, activate the input signals A and nA in the sub-cell according to the truth table of the 1-bit multiplication operation as shown in FIG. 2.

4. After the multiplication operation in the sub-cell is completed, either maintain the bottom plate voltage $V_{btm}$ of the computing capacitor at 0 or raise it to VDD, and output a result of the multiplication operation as the computing capacitor's bottom plate voltage $V_{btm}$, expressed as VDD× w×A.

It is to be understood that the sub-cell accomplishes the 1-bit multiplication operation (of the filter parameter w and the input signal A) with only 9 transistors, thus having a reduced sub-cell area and higher energy efficiency. It would be appreciated that the first NMOS transistor is included in the sub-cell for the purpose of control, and the 1-bit multiplication operation result of the input signal A and the filter parameter w stored in the SRAM cell is stored as the bottom plate voltage of the computing capacitor. For ease of description, the structure in which the SRAM cell is connected to the complementary transmission gate and contains 8 transistors is referred to as an 8T structure (or 8T sub-cell, as it contains eight transistors). This computing sub-cell is an extended version of the conventional 6T SRAM cell. This promises better economic benefits in practical applications by standardized sub-cell structure and allows enhanced sub-cell scalability. Further, instead of connecting the complementary transmission gate to the top plate of the computing capacitor as conventionally practiced, connecting it to the bottom plate of the computing capacitor can minimize computation errors, in particular those caused by clock feedthrough introduced with MOS transistor switches, charge injection occurring during on-to-off switching, non-linear parasitic capacitance at the drains/sources of the transistors in the complementary transmission gate, leakage of the transistors themselves, etc.

In order to further reduce the number of components in the sub-cell, in some embodiments, a plurality of the sub-cells may be arranged in a feasible shape such as 2×2, 4×2, etc., as shown in FIG. 3a, to form a computing cell. FIG. 3b shows such a computing cell composed of four sub-cells. In the figure, $WL_0$ denotes a word line common to the sub-cells a and b; $WL_1$, a word line common to the sub-cells c and d; $BL_0$ and $nBL_0$, bit lines common to the sub-cells a and c; $BL_1$ and $nBL_1$, bit lines common to the sub-cells b and d; $B_0$, the gate signal; $W_{0a}$-$W_{0d}$ and $nW_{0a}$-$nW_{0d}$, weight storage locations in the four sub-cells; and $V_{btm0}$, the bottom plate voltage of the first computing cell. In such a computing cell, each sub-cell retains its own 8T (sub-cell) structure, and all the sub-cells share a common first NMOS transistor and a common computing capacitor. Specifically, in such a computing cell, the output of the complementary transmission gate in each sub-cell is connected to the drain of the common first NMOS transistor, which is in turn connected to the bottom plate of the common computing capacitor. That is, every such computing cell contains only one first NMOS transistor and one computing capacitor, which are shared by all the sub-cells contained in the computing cell to perform 1-bit multiplication operations. Intuitively, this arrangement reduces the numbers of necessary first NMOS transistors and computing capacitors. For example, in a computing cell composed of 2×2 sub-cells, the number of the first NMOS transistors is reduced by 3 and the number of the computing capacitors is reduced by 3. It can be understood that the more sub-cells share one first NMOS transistor and one computing capacitor, the closer the average number of transistors in each sub-cells is to 8.

Moreover, as the area of a single capacitor is generally as large as several times that of a 6T SRAM cell, compared to each 1-bit multiplication sub-cell being separately equipped with an individual capacitor for storing a computation result, the arrangement with multiple 1-bit multiplication sub-cells sharing a single capacitor can greatly improve the storage capacity per unit area. That is, more filter parameters or weights can be stored per area, compared to the conventional techniques.

Additionally, the sub-cells in the computing cell may be activated in a time-multiplexed manner. That is, when any sub-cell is activated, all the other sub-cells are deactivated. The activated sub-cell can perform a 1-bit multiplication operation in the way as described above according to the truth table in FIG. 3c. Specifically, in some embodiments, the signals at the gates of the NMOS and PMOS transistors in the complementary transmission gates in the sub-cells are denoted as $A_{ij}$ and $nA_{ij}$, respectively, where i is the index of cells in a column and is a non-negative integer from 0 to n−1, and j is the index of sub-cells in each cell and j=a, b, c, d in the 2×2 sub-cells example. As can be appreciated, sharing of a computing capacitor and a first NMOS transistor among sub-cells means that the computing cell includes multiple sub-cells capable of multiplication and accumulation. It is noted that differing from separate individual sub-cells, when multiple sub-cells are arranged to form a single computing cell, the input signal $B_i$ at the first NMOS transistor's gate is controlled separately from the input signal $nA_{ij}$ at the PMOS gate of the complementary transmission gate in each sub-cell. In the case of time-multiplexing, although the complementary input signal $nA_{ij}$ in the activated sub-cell at a given time remains at the same voltage level as the signal $B_i$, this is no longer realized by connection at a common node. It will be appreciated that sharing of a computing capacitor and a first NMOS transistor among sub-cells means that the computing cell includes multiple sub-cells capable of multiplication and accumulation. In contrast to the same number of separate sub-cells, the computing cell saves the use of n−1 computing capacitors and n−1 first NMOS transistors, making the number of transistors required for each sub-cell to perform a 1-bit multiplication operation closer to 8. Due to being fabricated by different processes, the area of the computing capacitor is typically several times that of a SRAM cell. By reducing the number of computing capacitors per unit area, the sharing arrangement can impart higher storage capacity to an array module made up of those computing cells.

It will be appreciated that the above sharing arrangement is also applicable to any other sub-cell structure than the conventional 6T SRAM, which can equally perform the functions of storing and reading 1-bit filter parameters.

Figure 4A:
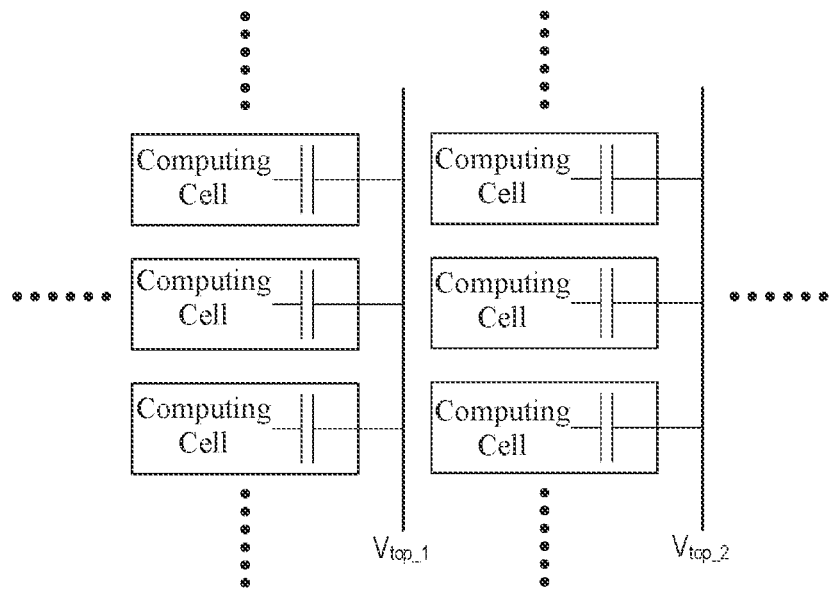
FIG. 4a is a schematic illustration of a MAC array according to an embodiment of the present invention.

In a second aspect, a multiply-accumulate (MAC) array for MAC operation is provided on the basis of the sub-cells according to the first aspect and possible implementations thereof. Referring to FIG. 4a, the MAC array includes a plurality of the computing cells, and in each column of computing cells, the top plates of the computing capacitors are connected to a respective accumulation bus.

In contrast to an MAC array constructed from individual sub-cells, the computing cells with shared capacitors and transistors enable the MAC array to store more neural network parameters or computation results from the previous network layer. Specifically, the results of 1-bit multiplication operations in the computing cells are stored in the computing capacitors, and the 1-bit multiplication results from the computing cells of each column in the MAC array are accumulated by the respective accumulation bus to which the top plates of the computing capacitors are connected.

For in-memory computing, reducing data movement between inside and outside of the computing chip is a direct way to reduce power consumption. It will be appreciated that this design allows the MAC array to contain more SRAM cells per unit area, which can store more filter parameters compared to conventional techniques. In each cell, after an in-memory computation is completed in one sub-cell, another in-memory computation can be immediately initiated with a filter parameter stored in another sub-cell of the same cell without waiting for the transfer of data from outside into the SRAM. This results in enhancements in throughput, and results in reductions in power consumption and area consumption. As the area of a computing capacitor is typically several times that of a conventional 6T SRAM cell, reducing the number of capacitors in each computing cell can improve the array's throughput and reduce its power consumption.

Figure 4B:
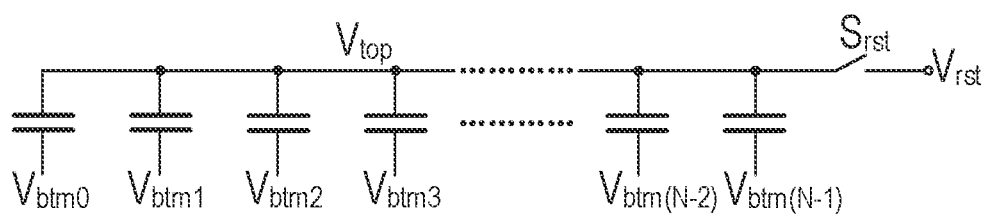
FIG. 4b schematically illustrates bottom and top plate voltages of a computing capacitor according to an embodiment of the present invention.

Referring to FIG. 4b, in particular, as the top plates of the computing capacitors of each column are connected together through the respective accumulation bus, the voltage on the accumulation bus is $V_{top}$. It is clarified that the plurality of computing cells are column-wise arranged so that each computing cell corresponds to one computing capacitor and contains a plurality of sub-cells according to the first aspect or embodiments thereof. In FIG. 4b, $V_{btm0}$-$V_{btm(N-1)}$ denote the bottom plate voltages of the first through N-th computing cells.

In some embodiments, the MAC array may follow "Procedure I" below to perform a MAC operation:

1. First write filter parameters (or activations from computation in the previous network layer) into the sub-cells following the 6T SRAM write procedure.
2. Reset the top plate voltage $V_{top}$ of the computing capacitors to $V_{rst}$, which may be 0, through a reset switch $S_{rst}$ on the accumulation bus.
3. Reset the bottom plate voltages $V_{btmi}$ of the computing capacitors to 0 by raising the signal $B_i$ in every computing cell to VDD, keep the signals $A_{ij}$ and $nA_{ij}$ in every computing cell at 0 and VDD, respectively, and disconnect $S_{rst}$.
4. During computation, activate the signals $A_{ij}$ and $nA_{ij}$ in a time-multiplexed manner. For example, when $A_{0a}$ and $nA_{0a}$ are activated, $A_{0j}$ and $nA_{0j}$ (j=b, c, d) are deactivated, i.e. kept at 0 and VDD, respectively. It is to be noted that, during computation, $B_0$ in one computing cell is at the same voltage level as $nA_{0j}$ in the then activated sub-cell.
5. After the multiplication in each computing cell in a column is completed, either maintain the bottom plate voltages $V_{btmi}$ of the computing capacitors at 0, or raise them to VDD. Charge redistribution occurs in the computing capacitors in the column, similar to the charge distribution in capacitors of a successive approximation register (SAR) digital-to-analog converter (DAC), and when not considering non-idealities such as parasitic capacitance and so on, the analog output voltage $V_{top}$ of the computing capacitors in the column represents the accumulation result expressed in the equation below, as shown in FIG. 4b.

$$V_{top} = \frac{VDD}{N} \sum_{i=0}^{N-1} W_{ij} A_{ij} (j = a, b, c, d)$$

In other embodiments, the MAC array may follow "Procedure II" below to perform an operation:

1. Write filter parameters (or activations from computation in the previous network layer) into the sub-cell.
2. Reset the top plate voltage $V_{top}$ of the computing capacitors to $V_{rst}$ through a reset switch $S_{rst}$ on the accumulation bus. $S_{rst}$ keeps the connection between $V_{top}$ and $V_{rst}$.
3. Reset the bottom plate voltages $V_{btmi}$ of the computing capacitors to 0 by raising the signal $B_i$ in every cell to VDD and keep the signals $A_{ij}$ and $nA_{ij}$ in every cell at 0 and VDD, respectively.
4. During computation, activate the signals $A_{ij}$ and $nA_{ij}$ in a similar time-multiplexed manner.
5. After the multiplication in each computing cell in a column is completed, either maintain the bottom plate voltages $V_{btmi}$ of the computing capacitors at 0, or raise them to VDD, and then disconnect $S_{rst}$. With the bottom plate voltages $V_{btmi}$ being set to 0 or VDD, MOS switches in control means of the computing cells run a successive approximation algorithm for analog-to-digital conversion. As an example, if $V_{btmi}$ are all set to 0, the voltage $V_{top}$ can be expressed as:

$$V_{top} = V_{rst} - \frac{VDD}{N} \sum_{i=0}^{N-1} W_{ij} A_{ij} (j = a, b, c, d),$$

where $W_{ij}$ represents the filter parameter in the j-th sub-cell in the i-th computing cell.

The MAC array may be in particular used in computation with multi-bit weights. In these cases, each column of computing cells performs a bit-wise MAC operation, and the multi-bit computation results can be obtained by performing shift-add operations on digital representations resulting from analog-to-digital conversion. For example, in the case of k-bit weights or filter parameters, each column may perform a bit-wise MAC operation, e.g., the first column for the least significant bit (LSB) (i.e., performing a MAC operation between the 0-th bit values and the input signals) and the k-th column for the most significant bit (MSB) (i.e., performing a MAC operation between the k-th bit values and the input signals). It will be appreciated that each column separately performs an MAC operation for one bit of multi-bit binary weights, and the MAC results of all the involved columns contain k elements, which are then subject to analog-to-digital conversion and shift-add operations in the digital domain.

Figure 5A:
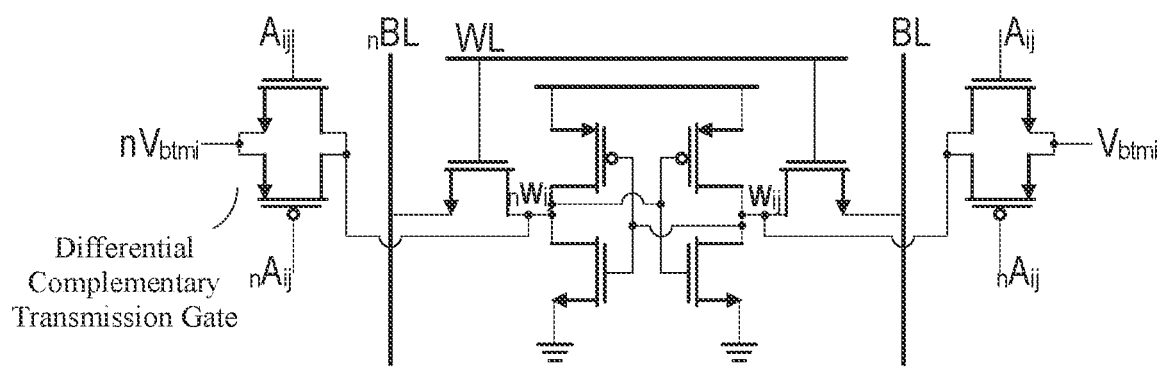
FIG. 5a is a schematic illustration of a 10T structure according to an embodiment of the present invention.
Figure 5B:
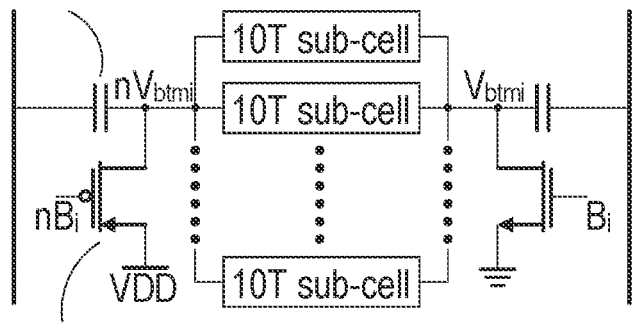
FIG. 5b is a schematic illustration of an extended computing cell version according to an embodiment of the present invention.

A differential version of the MAC array architecture may be used to reduce computation errors. In some embodiments, the MAC array further includes differential complementary transmission gates, differential computing capacitors and first PMOS transistors. In each computing cell of the MAC array, the output of the CMOS inverter consisting of the MOS transistors $M_3$, $M_4$ in each conventional 6T SRAM cell is connected to an input of a respective one of the differential complementary transmission gates, and all these differential complementary transmission gates connected to the respective CMOS inverters each consisting of the MOS transistors $M_3$, $M_4$ are connected at their outputs to a drain of a respective one of the first PMOS transistors. The drain of the respective first PMOS transistor is in turn connected to a bottom plate of a respective one of the differential computing capacitors, and a source thereof is connected to VDD. Differential multiplication results are stored as bottom plate voltages of the respective differential computing capacitors, and top plates of the differential computing capacitors of the differential computing cells in each column are connected to a respective differential accumulation bus. For ease of description, referring to FIG. 5a, the structure in which the 6T SRAM cell is connected to the differential complementary and complementary transmission gates is referred to as a 10T structure (or 10T sub-cell, as it contains ten transistors). Accordingly, the computing cells connected in the MAC array in FIG. 5b are referred to as first differential cells. These first differential cells can be considered as an extension of the above-described computing cells, and hence of the sub-cells constituting the computing cells. In this embodiment, in addition to the 10T structures, each first differential cell further includes some commonly shared transistors and capacitors, more specifically, a common first NMOS transistor, a common first PMOS transistor, a common differential computing capacitor and a common computing capacitor. Further, the sub-cells in each first differential cell may be activated in a similar time-multiplexed manner.

Figure 6A:
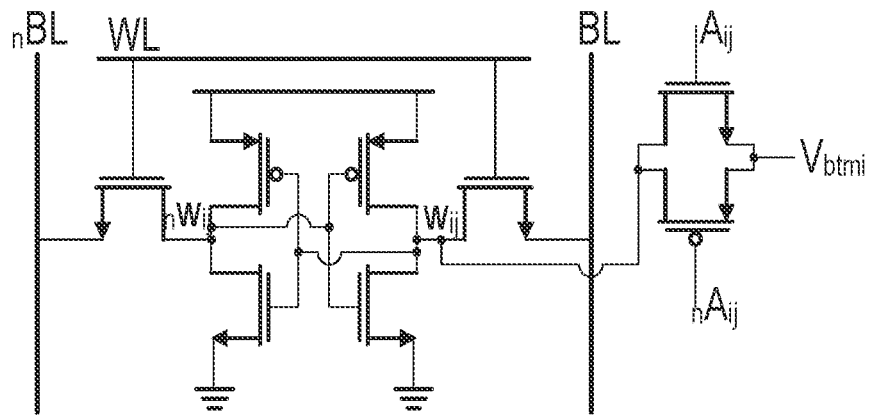
FIG. 6a is a structural schematic of an 8T structure according to an embodiment of the present invention.
Figure 6B:
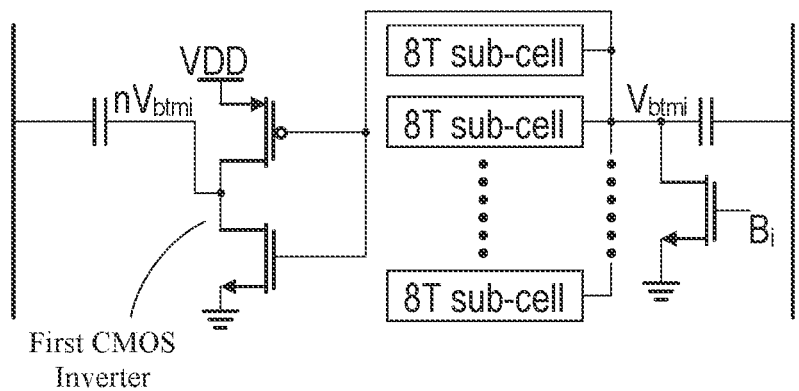
FIG. 6b is a schematic illustration of an extended computing cell version according to another embodiment of the present invention.

In some other embodiments of the differential MAC array architecture, the MAC array may further include first CMOS inverters and differential computing capacitors. In each computing cell of the MAC array, the outputs of all the complementary transmission gates are connected to an input of a respective one of the first CMOS inverter, and an output of the respective first CMOS inverter is connected to a bottom plate of a respective one of the differential computing capacitors. Likewise, referring to FIG. 6a, for ease of description, the structure in which the 6T SRAM cell is connected to the complementary transmission gate is referred to as an 8T structure (or 8T sub-cell, as it contains eight transistors). Accordingly, the computing cells connected in the MAC array in FIG. 6b are referred to as second differential cells, in which differential multiplication results are stored as bottom plate voltages of the differential computing capacitors. As can be appreciated, in this embodiment, in addition to the 8T structures, each second differential cell further includes some commonly shared transistors and capacitors, more specifically, a common first NMOS transistor, a common first CMOS inverter, a common differential computing capacitor and a common computing capacitor. Further, the sub-cells in each second differential cell may be activated in a similar time-multiplexed manner.

Figure 6C:
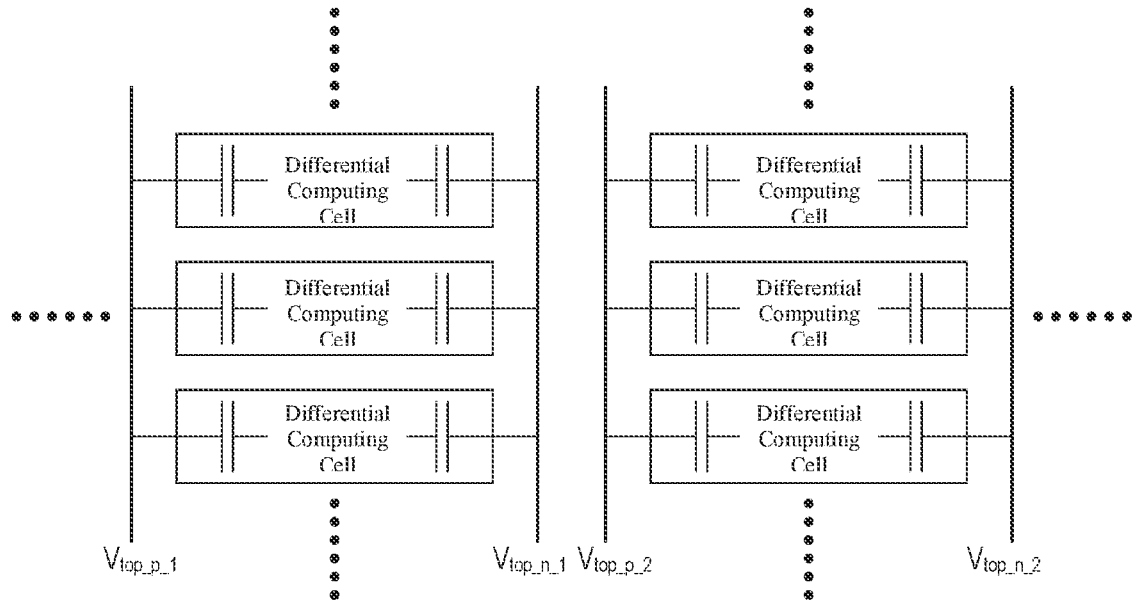
FIG. 6c is a structural schematic of a differential MAC array architecture according to an embodiment of the present invention.

It is to be noted that both the first and second differential cells are extensions of the above-discussed computing cells, and their naming is intended only to facilitate description of the circuit structures. FIG. 6c is a schematic diagram of a differential MAC array architecture made up of the above-described first or second differential cells, in which in each column, the top plates of all the computing capacitors are connected to a respective accumulation bus, and the top plates of all the differential computing capacitors are connected to a respective differential accumulation bus. In FIG. 6c, $V_{top\_p\_1}$, $V_{top\_p\_2}$, $V_{top\_n\_1}$ and $V_{top\_n\_2}$ denote voltages resulting from computation in the differential computing cells.

Figure 7:
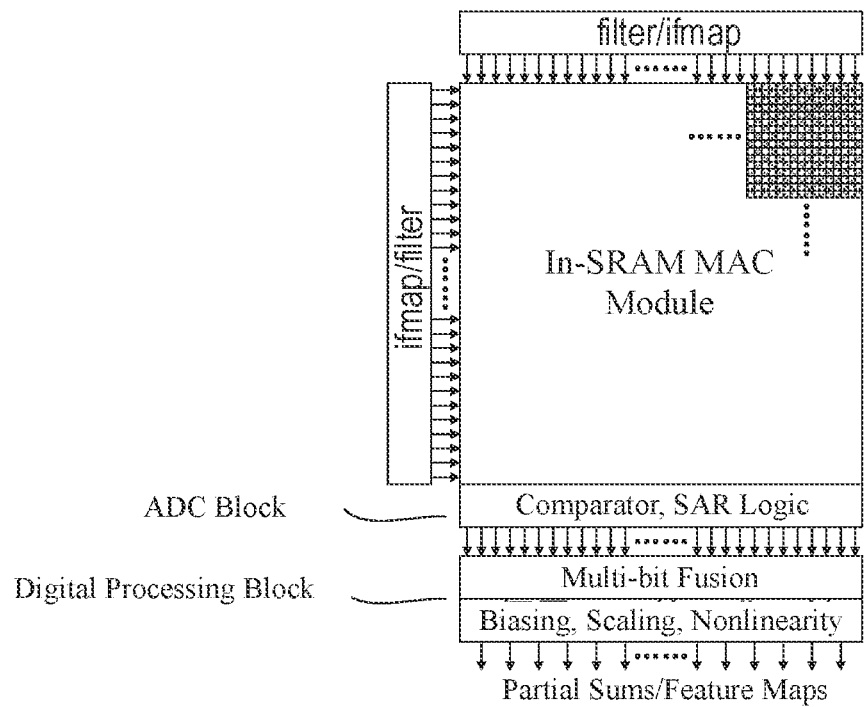
FIG. 7 is a schematic diagram illustrating an in-memory computing module according to an embodiment of the present invention.

In a third aspect, there is provided a bit-width reconfigurable mixed-signal computing module. Referring to FIG. 7, it includes: the MAC array according to the second aspect or any possible implementation thereof, wherein column-wise accumulation results are represented in the form of analog voltages, i.e., the top plate voltages $V_{top}$ of the capacitors described in connection with the above embodiments; a filter/ifmap block for providing filter parameters (or computation results from the previous network layer in the case of a neural network, as will be appreciated) that are written into and stored in the MAC array; an ifmap/filter block for providing an input to the MAC array, more specifically, to the complementary transmission gates in the computing cells, which is subject to MAC operations with the filter parameters or the activations from the previous network layer; an ADC block for converting the analog voltages resulting from the MAC operations to their digital representations; and a digital processing block for performing at least multi-bit fusion, biasing, scaling or nonlinearity on the digital representations output from the ADC block and for outputting results in the form of partial sums or activations (feature maps) directly usable as an input to the next network layer.

It will be appreciated that, the module described herein, when used in a neural network to perform MAC operations, may be typically able to pre-load the necessary filter parameters (weights) at once because it contains more memory elements (i.e., 6T SRAM cells) per unit area. After computation in one layer is completed, the output partial sums or final activations (feature maps) directly usable in computation in the next network layer can be immediately subject to MAC operations with the filter parameters (weights) pre-loaded and stored in the module, saving the time waiting for off-chip data movement and the power consumed therein as well. In addition, the high throughput of the module can improve on-chip storage capabilities. For example, apart from the filter parameters, the memory cells in the MAC array can also be used to store the output activations (feature maps) of the same network layer.

It will be appreciated that, in addition to the sharing of transistors and computing capacitors within the computing cells and MAC array as described above in the first and second aspects, in fact, the computing cells also share some transistors and other devices involved in the analog-to-digital conversion and digital processing in other regions of the module than the MAC array.

According to the present invention, the ADC block may be parallel capacitive SAR ADCs for converting the top plate voltages $V_{top}$ column-wise output from the computing cells to their digital representations. Each of the SAR ADCs may include a MAC DAC, a SAR DAC, a comparator, a switching sequence and SAR logic for controlling the switching sequence. Compared to SAR ADCs of other types such as resistive and hybrid resistive-capacitive, the parallel capacitive SAR ADCs allow more full utilization of the inventive structures, resulting in a reduced number of components and a reduced area. The MAC DAC is composed of the parallel capacitors in a respective column of computing cells in the MAC array. It will be appreciated that the output voltage of the MAC DAC is $V_{top}$. The SAR DAC includes (B+1) parallel capacitors and B=$\log_2$ N, where N is the number of capacitors in the MAC DAC. The capacitors include B capacitors with capacitances binarily decreasing from an MSB one to an LSB one and a redundant capacitor of the same capacitance as the LSB capacitor. As an example, when the number of capacitors in the MAC DAC is N=8, then B=3, the capacitance of the MSB capacitor $C_{B-1}$ is C, the capacitance of the second MSB capacitor $C_{B-2}$ is C/2, and the capacitance of the LSB capacitor $C_0$ is C/4. In this case, a reference voltage of the SAR DAC is allocated to the MSB to LSB capacitors respectively at ratios of 1/2, 1/4, 1/8, and the capacitance of the redundant capacitor $C_U$ is C/4. The B capacitors and the redundant capacitor are connected in parallel at one end, and the other ends of the B capacitors are connected to the switching sequence, with the other end of the redundant capacitor being always grounded. A free end of the switching sequence includes a VDD terminal and a ground terminal. The SAR logic controls the switching sequence.

Figure 8:
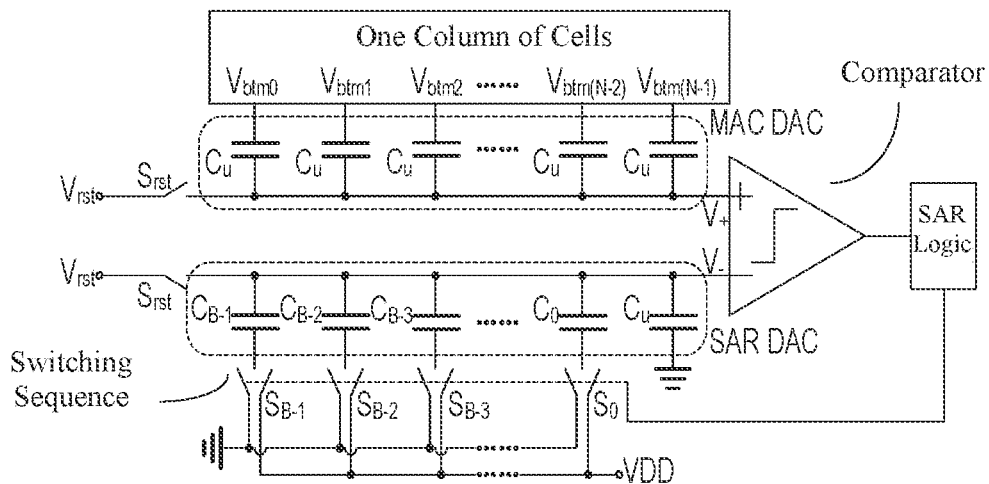
FIG. 8 is a schematic illustration of an ADC block according to an embodiment of the present invention.

In one embodiment, as shown in FIG. 8, the output voltage $V_{top}$ of the MAC DAC is taken as a positive input $V_+$ to the comparator, and an output $V_{SAR}$ of the SAR DAC is taken as a negative input $V_-$ to the comparator. The SAR logic controls the switching sequence to bring the negative input $V_-$ to approximate the positive input $V_+$. The final SAR logic output is the digital representation of $V_+$. In particular, the MAC array's activation sparsity may spare some capacitors in the SAR DAC from switching in order to obtain higher energy efficiency and analog-to-digital conversion speed. For example, if it is known that after a MAC operation, the portion of the MAC capacitors with the bottom plate voltages $V_{btmi}$ being VDD is less than 25%, i.e., among 1-bit multiplications in the respective column of computing cells in the MAC array, there are more 1×0, 0×0 and 0×1 cases, and the number of 1×1 cases is less than ¼ of the total case number, then $S_{B-1}$ and $S_{B-2}$ in the switching sequence that correspond to the first two MSBs capacitors of the SAR DAC, i.e., $C_{B-1}$ and $C_{B-2}$, may be switched to the ground terminal rather than unconditionally activating all the capacitors in the SAR DAC during digital-to-analog conversion. This can result in power savings. It is noted that the connection of the comparator's $V_+$ and $V_-$ sides shown in the figure is for ease of illustration, and in fact, the two sides may be swapped.

Figure 9:
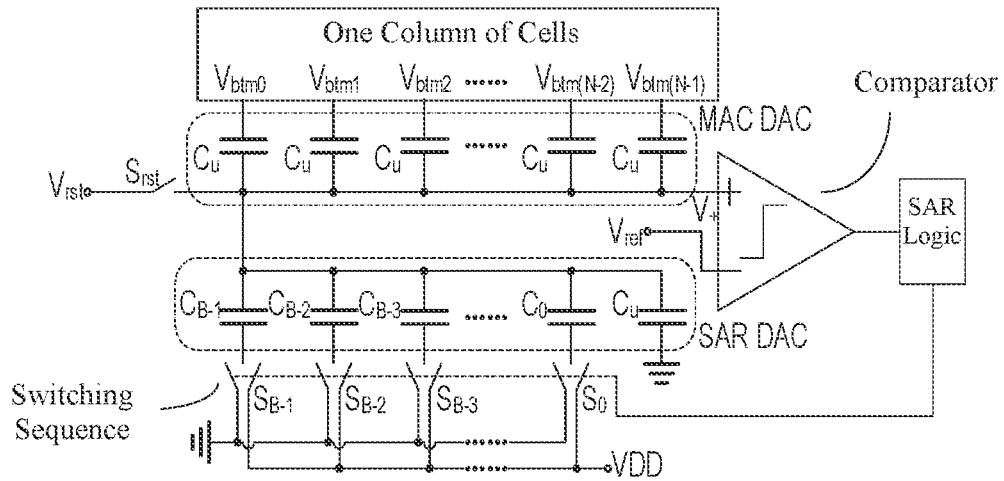
FIG. 9 is a schematic illustration of an ADC block according to another embodiment of the present invention.

In another embodiment, referring to FIG. 9, the MAC DAC and the SAR DAC may be connected together, thus connecting all the capacitors in parallel. In this case, a generated total voltage is taken as the positive input $V_+$ and $V_{ref}$ as the negative input $V_-$ to the comparator. The SAR logic controls the switching sequence to bring the positive input $V_+$ to approximate $V_{ref}$. It is noted that this embodiment is suitable for MAC operations that follow "Procedure I" as described above. If $V_{rst}$=0 and no circuit non-idealities are considered, $V_{ref}$ that is connected to the comparator's negative input $V_-$ may be either 0 or VDD/2. For example, if $V_{ref}$=0 and the capacitors in the SAR DAC are initially connected to VDD through the switches from $S_0$ to $S_{B-1}$, the SAR operation can bring $V_+$ back to 0 while giving the digital representation. This provides $V_{rst}$=0 as required by the step of resetting the top plate voltage $V_{top}$ of the capacitors to 0 through a reset switch $S_{rst}$ in "Procedure I".

Figure 10:
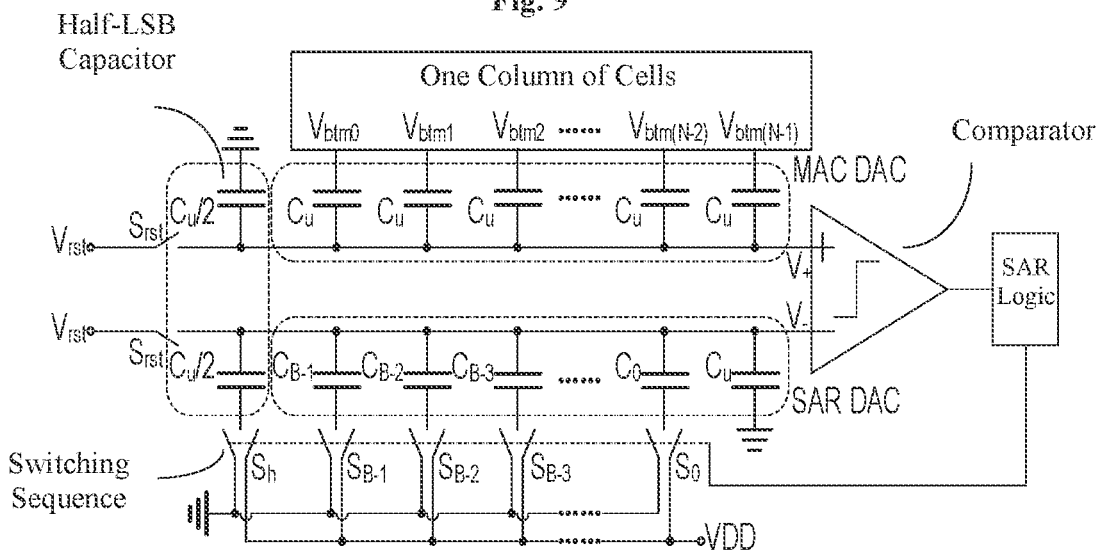
FIG. 10 is a schematic illustration of an ADC block according to a further embodiment of the present invention.

In the two embodiments shown in FIGS. 8 and 9, the comparator can easily suffer from the metastability problem during analog-to-digital conversion when the positive and negative inputs $V_+$ and $V_-$ of the comparator are infinitesimally close to each other. The metastability condition makes it impossible to differentiate the positive input $V_+$ from the negative input $V_-$ of the comparator during a short period of time because the analog MAC result that is to be quantized is not continuous in amplitude but discrete, and the discrete amplitude levels are aligned with the SAR DAC's. In order to alleviate this problem, in another embodiment as shown in FIG. 10, to each of the MAC DAC on the positive input $V_+$ side and the SAR DAC on the negative input $V_-$ side of the comparator, a half-LSB capacitor is added, which is connected in parallel with the other capacitors, in contrast to the architecture of FIG. 8. The other end of the half-LSB capacitor on the positive input $V_+$ side is always grounded, and the other end of the half-LSB capacitor on the negative input $V_-$ side may be connected to the switching sequence. This creates a half-LSB difference between the discrete analog voltage levels between the MAC DAC and the SAR DAC, providing extra error tolerance. Each of the half-LSB capacitors may consist of two LSB capacitors in series for good matching.

Figure 11:
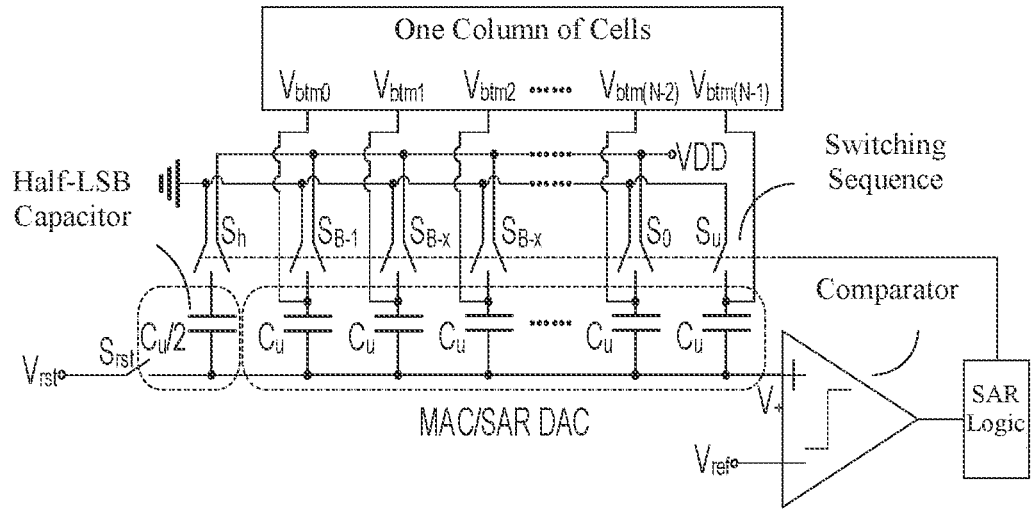
FIG. 11 is a schematic illustration of an ADC block according to a further embodiment of the present invention.

Another embodiment allows the reuse of the MAC DAC as the SAR DAC via bottom-plate sampling. As shown in FIG. 11, the positive input $V_+$ side of the comparator is connected to the MAC DAC and a half-LSB capacitor, in which both the capacitors in the first to (N−1)-th cells of the MAC DAC and the half-LSB capacitor may be connected to either the VDD terminal or ground terminal of the switching sequence, and the capacitor in the N-th cell may be selectively connected to the ground terminal. The negative input $V_-$ side of the comparator is not connected to any capacitor but to the voltage $V_{ref}$. In fact, the MAC DAC according to this embodiment also serves as the SAR DAC. It is noted that, according to this embodiment, "Procedure II" should be followed to perform MAC operations. Usually, $V_{ref}=V_{rst}$, and the comparator's positive input voltage $V_+$ goes back to $V_{rst}$ after the SAR conversion is complete. This provides $V_{rst}$ as required by the step of resetting the top plate voltage $V_{top}$ of the capacitors to $V_{rst}$ through a reset switch $S_{rst}$ in "Procedure II". In this way, both MAC operation and analog-to-digital conversion can be accomplished with a single capacitor array, avoiding mismatch and accuracy loss caused by the use of separate capacitor arrays for the MAC DAC for performing MAC operations and the SAR DAC for achieving analog-to-digital conversion and allowing the possibility of fully-differential SAR ADC.

Figure 12:
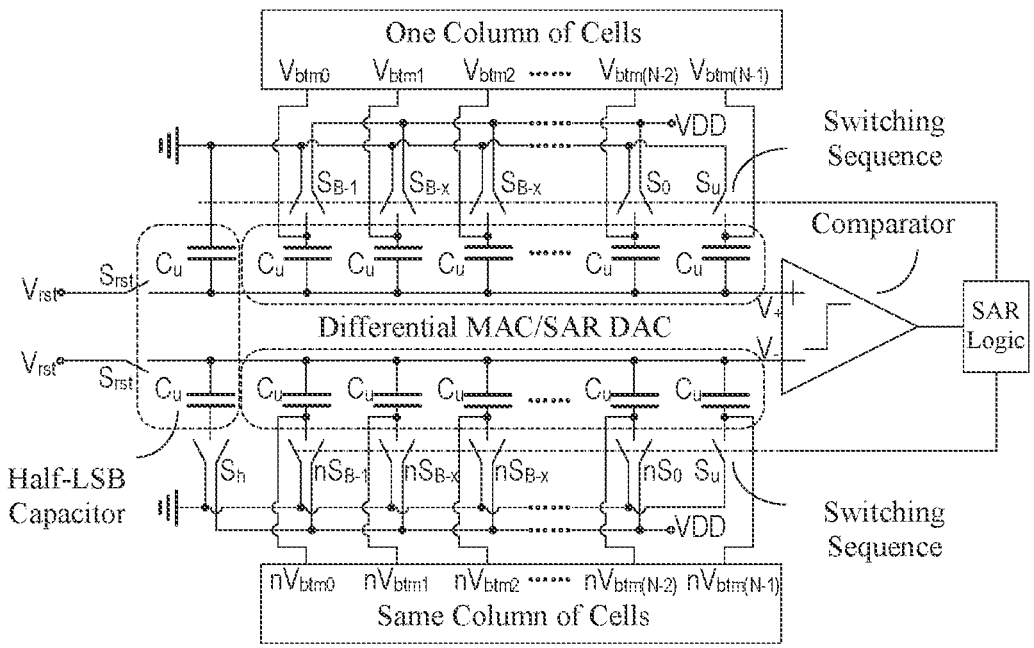
FIG. 12 is a schematic illustration of a differential ADC block according to a further embodiment of the present invention.

FIG. 12 shows a differential MAC architecture according to another embodiment based on the embodiment of FIG. 11, which solves the problem of common-mode dependent comparator input offset voltage. In FIG. 12, $nS_0$-$nS_{B-1}$ and $S_{B-X}$-$nS_{B-X}$ denote switches in the switching sequence. The positive input $V_+$ side of the comparator is connected to the MAC DAC and an additional LSB capacitor. During analog-to-digital conversion, both the capacitors in the first to (N−1)-th cells of the MAC DAC and the additional LSB capacitor may be connected to either the VDD terminal or ground terminal of the switching sequence, and the capacitor in the N-th cell may be selectively connected to the switching sequence's ground terminal. The comparator's negative input $V_-$ side is connected to both a differential MAC DAC and an additional differential LSB capacitor. During analog-to-digital conversion, both the capacitors in the first to (N−1)-th cells of the differential MAC DAC and the additional LSB capacitor may be connected to the switching sequence, and the capacitor in the N-th cell may be selectively connected to the switching sequence's ground terminal. The differential MAC DAC comprises a differential capacitor array in the MAC array. It is noted that the implementation of this differential MAC architecture requires the aforementioned differential version.

Figure 13:
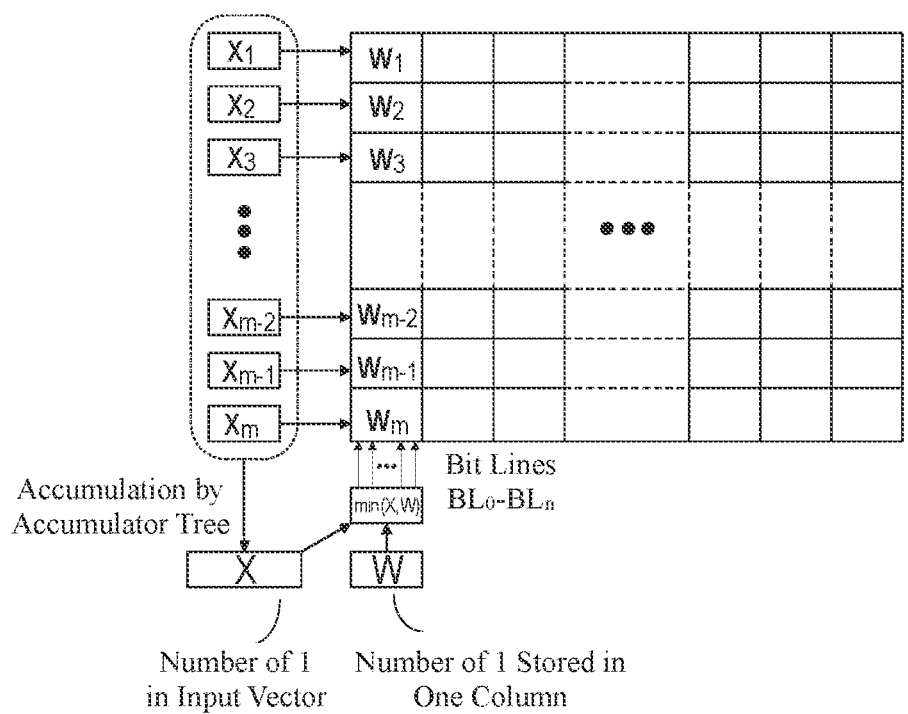
FIG. 13 schematically illustrates architecture with lower power consumption in analog-to-digital conversion according to an embodiment of the present invention.

In one embodiment, the SAR ADC for each column has a bit-width that is determined in real time by the sparsity of input data and values stored in the column. In this way, the number of capacitors in the binarily weighted capacitor array that need to be charged or discharged during analog-to-digital conversion may be greatly reduced on average, thus significantly reducing the power consumed during analog-to-digital conversion. In particular, as shown in FIG. 13, the real-time bit-width of the SAR ADC may be expressed as ceil(log$_2$(min(X, W)+1)), where "ceil" is a ceiling function; "min" is a minimum function; X is the number of 1 within a 1-bit input vector, and $X_1$-$X_m$ represent the first to m-th values of the 1-bit input vector, which may be obtained using an accumulator tree; W is the number of 1 stored in one column of the computing array, and $W_1$-$W_m$ represent weights stored in the first to m-th cells in the column, which may be obtained via off-chip computation and provided to the SAR logic before data storage of the computing array. The "min", "log$_2$" and "ceil" functions in the expression can be replaced with simple digital combinatorial logic, while the same computation result can be still obtained.

It is worth noting that the boundaries of the various blocks and modules included in the foregoing embodiments have been defined only based on their functional logic, and the present invention is not so limited, as alternate boundaries can be defined as long as the specified functions are appropriately performed. Also, specific names of the various functional components are intended to distinguish between these components rather than limit the scope of the present invention in any way.

The foregoing description presents merely preferred embodiments of the present invention and is not intended to limit the scope of the present invention in any way. Any and all changes, equivalent substitutions, modifications and the like made within the spirit and principles of the present invention are intended to be embraced in the scope thereof.

The invention claimed is:

1. An in-memory mixed-signal computing sub-cell, configured for 1-bit multiplication, the in-memory mixed-signal computing sub-cell comprising a conventional six-transistor (6T) static random-access memory (SRAM) cell, a complementary transmission gate, a first NMOS transistor and a computing capacitor, wherein the conventional 6T SRAM cell consists of MOS transistors $M_1$, $M_2$, $M_3$, $M_4$, $M_5$, $M_6$, in which a complementary metal-oxide-semiconductor (CMOS) inverter consisting of the MOS transistors $M_1$, $M_2$ is cross-coupled to a CMOS inverter consisting of the MOS transistors $M_3$, $M_4$, the cross-coupled two CMOS inverters store a 1-bit filter parameter, and the MOS transistors $M_5$, $M_6$ serve as control switches for bit lines for reading and writing the filter parameter, the CMOS inverter consisting of the MOS transistors $M_1$, $M_2$ in the conventional 6T SRAM cell comprises an output connected to an input of a complementary transmission gate, the complementary transmission gate comprising an output connected to a drain of the first NMOS transistor, the first NMOS transistor has a source that is grounded, and a drain connected to a bottom plate of the computing capacitor, the complementary transmission gate comprises an NMOS transistor having a gate connected to an input signal, and a PMOS transistor having a gate connected to a complementary input signal at a same voltage level during a time-multiplexed activation of the sub-cell as a signal input to a gate of the first NMOS transistor, a multiplication result of the input signal and the filter parameter is stored as a voltage on the bottom plate of the computing capacitor, and a plurality of said sub-cells are arranged to form a computing cell, the first NMOS transistor and the computing capacitor are shared among all the computing sub-cells in the computing cell.

2. A multiply-accumulate (MAC) array, configured for performing MAC operations and comprising in-memory mixed-signal computing sub-cells configured for 1-bit multiplication, the in-memory mixed-signal computing sub-cell comprising, a conventional six-transistor (6T) static random-access Memory (SRAM) cell, a complementary transmission gate, a first NMOS transistor and a computing capacitor, wherein:

the conventional 6T SRAM cell consists of MOS transistors $M_1$, $M_2$, $M_3$, $M_4$, $M_5$, $M_6$, in which a complementary metal-oxide-semiconductor (CMOS) inverter consisting of the MOS transistors $M_1$, $M_2$ is cross-coupled to a CMOS inverter consisting of the MOS transistors $M_3$, $M_4$, the cross-coupled two CMOS inverters store a 1-bit filter parameter, and the MOS transistors $M_5$, $M_6$ serve as control switches for bit lines for reading and writing the filter parameter, the CMOS inverter consisting of the MOS transistors $M_1$, $M_2$ in the conventional 6T SRAM cell comprises an output connected to an input of a complementary transmission gate, the complementary transmission gate comprising an output connected to a drain of the first NMOS transistor, the first NMOS transistor has a source that is grounded, and a drain connected to a bottom plate of the computing capacitor, the complementary transmission gate comprises an NMOS transistor having a gate connected to an input signal, and a PMOS transistor having a gate connected to a complementary input signal at a same voltage level during a time-multiplexed activation of the sub-cell as a signal input to a gate of the first NMOS transistor, a multiplication result of the input signal and the filter parameter is stored as a voltage on the bottom plate of the computing capacitor, and a plurality of said sub-cells are arranged to form a computing cell, the first NMOS transistor and the computing capacitor are shared among all the computing sub-cells in the computing cell wherein the MAC array comprises a plurality of computing cells, in each of which the outputs of the complementary transmission gates of all the sub-cells are connected to the bottom plate of the shared computing capacitor, wherein top plates of the computing capacitors in all the computing cells of each column are connected to a respective accumulation bus, and wherein a voltage on each accumulation bus corresponds to an accumulated sum of multiplication operation results of the respective column of the MAC array.

3. The MAC array of claim 2, further comprising a plurality of differential computing cells each comprising a differential complementary transmission gate, a differential computing capacitor and a first PMOS transistor, wherein in each of the computing cells in the MAC array, the output of the CMOS inverter consisting of the MOS transistors $M_3$, $M_4$ in each conventional 6T SRAM cell is connected to an input of a respective differential complementary transmission gate, and all the differential complementary transmission gates connected to the respective CMOS inverters each consisting of the MOS transistors $M_3$, $M_4$ are connected at outputs thereof to a drain of a respective first PMOS transistor, the drain of the respective first PMOS transistor is connected to a bottom plate of a respective differential computing capacitor, the respective first PMOS transistor has a source connected to VDD, wherein differential multiplication results are stored as bottom plate voltages of the respective differential computing capacitors, and wherein top plates of the differential computing capacitors of the differential computing cells in each column are connected to a respective differential accumulation bus.

4. The MAC array of claim 2, further comprising first CMOS inverters and differential computing capacitors, wherein in each of the computing cells in the MAC array, the outputs of all the complementary transmission gates are connected to an input of a respective one of the first CMOS inverters, and an output of the first CMOS inverter is connected to a bottom plate of a respective one of the differential computing capacitors, wherein differential multiplication results are stored as bottom plate voltages of the respective differential computing capacitors, and wherein top plates of the differential computing capacitors in each column are connected to a respective differential accumulation bus.

5. A bit-width reconfigurable mixed-signal in-memory computing module, comprising:

a multiply-accumulate (MAC) array, configured for performing MAC operations and comprising in-memory mixed-signal computing sub-cells configured for 1-bit multiplication, the in-memory mixed-signal computing sub-cell comprising a conventional six-transistor (6T) static random-access memory (SRAM) cell, a complementary transmission gate, a first NMOS transistor and a computing capacitor, wherein:

the conventional 6T SRAM cell consists of MOS transistors $M_1$, $M_2$, $M_3$, $M_4$, $M_5$, $M_6$, in which a complementary metal-oxide-semiconductor (CMOS) inverter consisting of the MOS transistors $M_1$, $M_2$ is cross-coupled to a CMOS inverter consisting of the MOS transistors $M_3$, $M_4$, the cross-coupled two CMOS inverters store a 1-bit filter parameter, and the MOS transistors $M_5$, $M_6$ serve as control switches for bit lines for reading and writing the filter parameter, the CMOS inverter consisting of the MOS transistors $M_1$, $M_2$ in the conventional 6T SRAM cell comprises an output connected to an input of a complementary transmission gate, the complementary transmission gate comprising an output connected to a drain of the first NMOS transistor, the first NMOS transistor has a source that is grounded, and a drain connected to a bottom plate of the computing capacitor, the complementary transmission gate comprises an NMOS transistor having a gate connected to an input signal, and a PMOS transistor having a gate connected to a complementary input signal at a same voltage level during a time-multiplexed activation of the sub-cell as a signal input to a gate of the first NMOS transistor, a multiplication result of the input signal and the filter parameter is stored as a voltage on the bottom plate of the computing capacitor, and a plurality of said sub-cells are arranged to form a computing cell, the first NMOS transistor and the computing capacitor are shared among all the computing sub-cells in the computing cell wherein the MAC array comprises a plurality of computing cells, in each of which the outputs of the complementary transmission gates of all the sub-cells are connected to the bottom plate of the shared computing capacitor, wherein top plates of the computing capacitors in all the computing cells of each column are connected to a respective accumulation bus, and wherein a voltage on each accumulation bus corresponds to an accumulated sum of multiplication operation results of the respective column of the MAC array and wherein column-wise accumulation results of multiplication results in the MAC array are represented as analog voltages;

a filter/ifmap block, configured for providing filter parameters or activations from computation in a previous layer, which are written into and stored in the MAC array;

an ifmap/filter block, configured for providing an input to the MAC array, which is subject to MAC operations with the filter parameters or the activations from computation in the previous layer;

an analog-to-digital conversion (ADC) block, configured for converting the analog voltages from the MAC array to digital representations; and a digital processing block, configured for performing at least multi-bit fusion, biasing, scaling or nonlinearity on an output of the ADC block, and wherein outputting results in a form of partial sums or activations are directly usable as an input to the next network layer.

6. The computing module of claim 5, wherein the ADC block is successive approximation register (SAR) ADCs of a binarily weighted capacitor array, each of the SAR ADCs comprising: a MAC digital-to-analog converter (DAC) consisting of the computing capacitors in a respective column of the MAC array; a SAR DAC, which is an array consisting of a plurality of binarily weighted capacitors and one redundant capacitor of a same capacitance as a least significant bit (LSB) capacitor therein; a comparator; a switching sequence; and SAR logic configured for controlling the switching sequence.

7. The computing module of claim 6, wherein an output voltage of the MAC DAC is taken as an input to one end of the comparator, and an output voltage of the SAR DAC is taken as an input to the other end of the comparator.

8. The computing module of claim 7, wherein one half-LSB capacitor is added to both positive V+ and negative V− input ends of the comparator, and wherein an output voltage of the MAC DAC and the half-LSB capacitor connected in parallel with the MAC DAC is taken as an input to the one end of the comparator, and an output voltage of the SAR DAC and the half-LSB capacitor connected in parallel with the SAR DAC is taken as an input to the other end of the comparator.

9. The computing module of claim 6, wherein an output voltage generated by the parallelly connected capacitors in the MAC DAC and in the SAR DAC is taken as an input to one end of the comparator, and a comparison voltage $V_{ref}$ is taken as an input to the other end of the comparator.

10. The computing module of claim 9, wherein a bit-width of the SAR ADC is determined in real time by the sparsity of input data and stored data in the computing array and expressed as $ceil(\log_2(\min(X, W)+1))$, where ceil is a ceiling function, min is a minimum function, X is the number of 1 within a 1-bit input vector, W is the number of 1 stored in one column of the computing array, and the real-time bit-width calculation expression is equivalently implemented by digital combinatorial logic in circuitry.

11. The computing module of claim 6, wherein the MAC DAC and a half-LSB capacitor are both connected to the switching sequence and reused as the SAR DAC, and an output voltage of the dual-use DAC is taken as an input to one end of the comparator, and wherein a comparison voltage $V_{ref}$ is taken as an input to the other end of the comparator.

12. The computing module of claim 6, wherein the SAR ADC further comprises a differential MAC DAC consisting of differential capacitors in a respective column of the MAC array.

13. The computing module of claim 12, wherein the MAC DAC and an additional LSB capacitor connected in parallel therewith are both connected to the switching sequence and reused as the SAR DAC, and an output voltage of the dual-use DAC is taken as an input to one end of the comparator, and wherein the differential MAC DAC and an additional differential LSB capacitor connected in parallel therewith are both connected to the switching sequence and reused as a differential SAR DAC, and an output voltage of the dual-use differential DAC is taken as an input to the other end of the comparator.

* * * * *